US008330461B2

(12) United States Patent
Madore

(10) Patent No.: US 8,330,461 B2
(45) Date of Patent: Dec. 11, 2012

(54) ACCELERATED DYNAMIC MAGNETIC RESONANCE IMAGING IN THE PRESENCE OF MOTION AND OTHER TIME-RELATED DISRUPTIONS

(75) Inventor: Bruno Madore, Brookline, MA (US)

(73) Assignee: The Brigham and Women's Hospital, Inc., Boston, MA (US)

( * ) Notice: Subject to any disclaimer, the term of this patent is extended or adjusted under 35 U.S.C. 154(b) by 409 days.

(21) Appl. No.: 12/518,266

(22) PCT Filed: Dec. 10, 2007

(86) PCT No.: PCT/US2007/025316
§ 371 (c)(1),
(2), (4) Date: Dec. 21, 2009

(87) PCT Pub. No.: WO2008/073423
PCT Pub. Date: Jun. 19, 2008

(65) Prior Publication Data
US 2010/0117647 A1    May 13, 2010

Related U.S. Application Data

(60) Provisional application No. 60/869,257, filed on Dec. 8, 2006.

(51) Int. Cl.
*G01V 3/00* (2006.01)
(52) U.S. Cl. ........................ 324/309; 324/307
(58) Field of Classification Search .......... 324/300–322; 600/407–445
See application file for complete search history.

(56) References Cited

U.S. PATENT DOCUMENTS

| 5,323,110 | A | * | 6/1994 | Fielden et al. ................. 324/309 |
| 5,390,258 | A | * | 2/1995 | Levin ............................. 382/131 |
| 6,144,873 | A | * | 11/2000 | Madore et al. ................. 600/410 |
| 6,556,009 | B2 | * | 4/2003 | Kellman et al. ............... 324/309 |
| 6,850,062 | B2 | | 2/2005 | Mitchell et al. |
| 6,905,465 | B2 | * | 6/2005 | Angelsen et al. ............. 600/437 |
| 7,590,589 | B2 | * | 9/2009 | Hoffberg ........................ 705/37 |
| 7,898,252 | B2 | * | 3/2011 | Crozier et al. ................. 324/307 |

OTHER PUBLICATIONS

PCT International Search Report and Written Opinion, PCT/US2007/025316, Jun. 5, 2008.
Ablitt, et al., Respiratory Reordered UNFOLD Perfusion Imaging, J. Magn. Reson. Imaging, 2004, 20:817-825.
Di Bella, et al., Comparison of Temporal Filtering Methods for Dynamic Contrast MRI Myocardial Perfusion Studies, Magn. Reson. Med., 2003, 49:895-902.
Fredrickson, et al., Temporal Resolution Improvement in Dynamic Imaging, Magn. Reson. Med., 1996, 35:621-625.
Hu, et al., Reduction of Field of View for Dynamic Imaging, Magn. Reson. Med., 1994, 31:691-694.
Kellman et al., Adaptive Sensitivity Encoding Incorporating Temporal Filtering (TSENSE), Magn. Reson. Med., 2001, 45:846-852.
Korin, et al., Compensation for Effects of Linear Motion in MR Imaging, Magn. Reson. Med., 1989, 12:99-113.

(Continued)

*Primary Examiner* — Brij Shrivastav
(74) *Attorney, Agent, or Firm* — Quarles & Brady, LLP

(57) ABSTRACT

Embodiments of the present invention relate to accelerated dynamic magnetic resonance imaging (MRI) and, more particularly, to imaging situations where the temporal-encoding strategy is disrupted by time-related events, such as breathing motion.

18 Claims, 10 Drawing Sheets

OTHER PUBLICATIONS

Madore et al., Unaliasing by Fourier-Encoding the Overlaps Using the Temporal Dimension (UNFOLD), Applied to Cardiac Imaging and fMRI, Magn. Reson. Med., 1999, 42:813-828.

Madore, Using UNFOLD to Remove Artifacts in Parallel Imaging and in Partial-Fourier Imaging, Magn. Reson. Med., 2002, 48:493-501.

Madore, UNFOLD-SENSE: A Parallel MRI Method with Self-Calibration and Artifact Suppression, Magn. Reson. Med., 2004, 52:310-320.

Madore, A New Approach Toward Free-Breathing 3D Cardiac Imaging, Proc. Intl. Soc. Mag. Reson. Med., 2005, 13:2232.

Peters, et al., Undersampled Projection Reconstruction Applied to MR Angiography, Magn. Reson. Med., 2000, 43:91-101.

Pipe, Reconstructing MR Images From Undersampled Data: Data-Weighting Considerations, Magn. Reson. Med., 2000, 43:867-875.

Tsao, et al., k-t BLAST and k-t SENSE: Dynamic MRI with High Frame Rate Exploiting Spatiotemporal Correlations, Magn. Reson. Med., 2003, 50:1031-1042.

Wang, et al., Respiratory Motion of the Heart: Kinematics and the Implications for the Spatial Resolution in Coronary Imaging, Magn. Reson. Med., 1995, 33:713-719.

Xiang et al., K-Space Description for MR Imaging of Dynamic Objects, Magn. Reson. Med., 1993, 29:422-428.

\* cited by examiner

MODIFIED TRANSFORM IN TIME, USING SET $\Omega_2$

ACCELERATED DYNAMIC MAGNETIC RESONANCE IMAGING IN THE PRESENCE OF MOTION AND OTHER TIME-RELATED DISRUPTIONS

CROSS-REFERENCE TO RELATED APPLICATIONS

This application claims priority to PCT International Application No. PCT/US2007/025316 filed on Dec. 10, 2007, which claims priority to U.S. Provisional Patent Application No. 60/869,257 filed on Dec. 8, 2006, which is hereby incorporated by reference herein in its entirety.

STATEMWNT REGARDING FEDERALLY SPONSORED RESEARCH

This invention was made with governmnet support under HL073319 awarded by the National Institutes of Health. The government has certain rights in the invention.

FIELD OF THE INVENTION

Some embodiments of the present invention relate to dynamic magnetic resonance imaging (MRI) and, more particularly, to dynamic MRI in the presence of motion and other time-related disruptions.

BACKGROUND OF THE INVENTION

UNFOLD is an imaging method that speeds the image acquisition process in time-resolved applications such as magnetic resonance imaging (MRI) [1]. As its name suggests, UNFOLD ("Unaliasing by Fourier-encoding the Overlaps using the temporaL Dimension") typically modulates aliased signals through the use of Fourier basis functions. UNFOLD forces aliased signals to behave in specific ways through time, so unwanted signals can be detected and removed. UNFOLD was originally introduced as a stand-alone method, and acceleration factors ranging from about 2 to as much as 8 have been presented [1]. More recently, it has been recognized that UNFOLD forms a valuable supplement to parallel imaging, in hybrid methods such as UNFOLD-SENSE, TSENSE and k-t SENSE [2-5]. UNFOLD can provide the coil-sensitivity information required by parallel imaging without the need for an extra calibration scan [3, 4], and it can reduce the artifact content as compared to parallel imaging alone [2-5]. Additional details regarding UNFOLD are provided in Madore U.S. Pat. No. 6,144,873, which is hereby incorporated by reference herein in its entirety.

Although UNFOLD has been successfully used in applications such as functional Magnetic Resonance Imaging (fMRI) and breath-held cardiac imaging, its use in the presence of breathing motion has proved more difficult. As noted by Di Bella et. al. [6] and by Ablitt et. al. [7], the respiration-related motion seen in myocardial perfusion studies may cause artifacts in UNFOLD-generated images. Artifacts in two-fold accelerated perfusion studies may consist of an edge-enhanced version of the anterior part of the thoracic cage, displaced along the phase-encoding direction from its true location, and sometimes partly obscuring the heart. Such artifacts can be suppressed to some extent by combining UNFOLD with parallel imaging. While UNFOLD has been shown to suppress artifacts caused by shortcomings in the parallel-imaging approach [2], the converse is equally true, and ghosting artifacts from UNFOLD can be suppressed by parallel imaging.

Ablitt et. al. [7] created a free-breathing version of UNFOLD for myocardial perfusion imaging, by separating data according to respiratory phase and applying UNFOLD separately to the different respiration-resolved bins. As discussed in [7], sorting the data into respiratory bins before applying UNFOLD filters should lead to a proper treatment of tissues moving due to respiration, but might be detrimental to signal from tissues undergoing other types of dynamic changes, such as contrast uptake.

In view of the foregoing, it would be desirable to provide improved methods for accelerated dynamic magnetic resonance imaging in the presence of breathing motion, and of other possible disruptions to the normal UNFOLD encoding scheme.

SUMMARY OF THE INVENTION

Some embodiments of the present invention relate to systems and methods for accelerated dynamic magnetic resonance imaging (MRI), that produce images despite disruptions such as breathing motion. In some embodiments, these systems and methods suppress artifacts (e.g., ghosting or blurring) that would otherwise be included in the image if the image were generated by conventional UNFOLD or UNFOLD-SENSE processing.

For example, in some embodiments, a method for accelerated dynamic MR imaging is provided that is able to handle time-related disturbances (e.g., disturbances caused by motion). The disturbances may be caused by departures, in the temporal data sampling scheme, from the regular sampling scheme normally expected in the UNFOLD method. Data is acquired at a first time point and a first k-space location, and at a second time point and a second k-space location. Temporal variations associated with time related disturbances are separated from temporal variations not associated with these disturbances. A first filter is applied, in a first function space, to the data not associated with the disturbances to obtain a first temporary dataset. A second filter is applied, in a second function space, to the data associated with the disturbances to obtain a second temporary dataset. The first and second temporary datasets are combined to obtain a result dataset. In some embodiments, the method may include evaluating the motion of an imaged object. In some embodiments, parallel imaging may be used.

In some embodiments, systems and methods are provided for imaging an object (e.g., the human heart). K-space data about the object is acquired. In the temporal frequency domain corresponding to the Fourier basis ($\Omega_1$), the frequency content of a given k-space data point from the k-space data is represented by a vector $\vec{S}$. The vector $\vec{S}$ is projected along a vector $\vec{h}_{v2}$ to obtain projected k-space data, where the vector $\vec{h}_{v2}$ corresponds to a non-Fourier basis $\Omega_2$. At least one image of the object is produced based at least in part on the projected k-space data.

In some embodiments, systems and methods are provided for estimating movement of the object. Movement of the object may be estimated based at least in part on, for example, the k-space data, a respiration-monitoring belt, or navigator echoes. The vector $\vec{h}_{v2}$, which corresponds to the non-Fourier basis $\Omega_2$, may be defined based at least in part on the estimate.

In some embodiments, a sensitivity map for use in estimating the movement of the object may be generated based at least in part on the k-space data. Base at least in part on the sensitivity map, a correlation function may be generated. The correlation function may be correlated with an image in order to estimate the movement of the object, where the estimate includes a displacement and a direction of orientation.

According to some embodiments, projecting the vector $\vec{S}$ along $\vec{h_{v2}}$ includes projecting $\vec{S}$ along multiple vectors $\vec{h_{v2}}$. The multiple vectors $\vec{h_{v2}}$ may be a subset of the basis functions included in the non-Fourier basis $\Omega_2$, where the non-Fourier basis may be defined as follows:

$$G_i(k_x, k_y, t) = F_i(t) \cdot M_d(k_x, k_y, t).$$

where $M_d$ is a modulation of the k-space data caused by motion of the object.

In some embodiments, projecting $\vec{S}$ along multiple vectors $\vec{h_{v2}}$ includes iteratively projecting $\vec{S}$ along multiple vectors $\vec{h_{v2}}$ as follows:

$$\vec{S_j} = \vec{S_{j-1}} - f_{DC+Ny}(p(j-1)) \cdot D(k_x, k_y, p(j-1)) \cdot \frac{\overline{g_{p(j-1)}}}{l_{p(j-1)}}.$$

where j is an index, p(j) defines the order in which the projections are made, $D(k_x, k_y, p(j-1))$ is a matrix that represents the dot product between $\vec{S}$ and each vector $\vec{h_{v2}}$, $g_{p(j-1)}$ is a temporal frequency representation of $G_i(k_x, k_y, t)$, and $l_{p(j-1)}$ is scaling factor. The value of $\vec{S}$ after all of the projections have been performed may be the signal that is treated in the domain defined by the Fourier basis $\Omega_1$.

In still other embodiments of the present invention, systems and methods are provided that use a non-regular sampling function to image an object. Such a sampling function is not shifted by a fixed increment from one time frame to the next time frame. K-space data about the object may be acquired according to the non-regular sampling function, and at least one image of the object may be produced based at least in part on the K-space data. In some embodiments, the image may be produced using a modified version of UNFOLD or UNFOLD-SENSE.

BRIEF DESCRIPTION OF THE DRAWINGS

For a better understanding of the present invention, including the various objects and advantages thereof, reference is made to the following detailed description, taken in conjunction with the accompanying illustrative drawings, in which.

DETAILED DESCRIPTION OF THE INVENTION

Figure 1A:
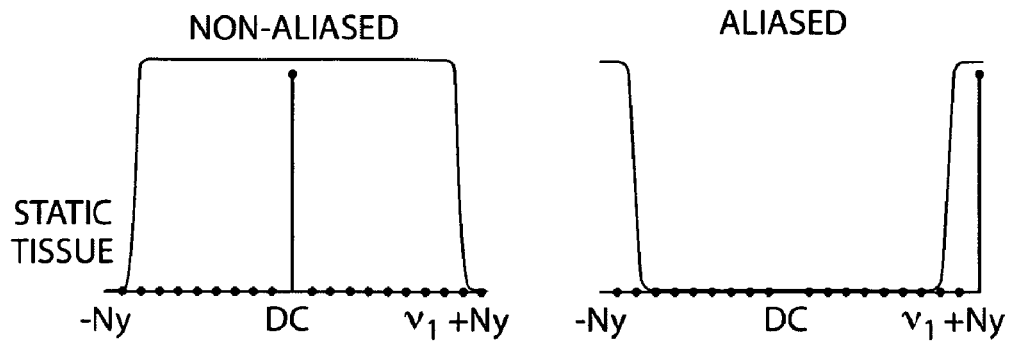
FIG. 1a illustrates a conventional UNFOLD method for encoding signal data detected by magnetic resonance imaging (MRI), which uses a normal Fourier basis $\Omega_1$ to encode aliased and non-aliased signal for static object(s) (e.g., tissue) into well-defined distinct frequency regions in the temporal frequency domain (Nyquist and DC, respectively)

An improved image processing technique is provided that accommodates temporal encoding disruptions, such as displacements caused by breathing and other unexpected events in time. The improvement provides an enhanced ability to suppress in the images aliasing artifacts that are caused by the disruptions. While the following description focuses primarily on disruptions caused by respiratory motion, it will be understood that other types of disruption are envisioned and can be corrected for, such as other forms of bulk motion and/or departures from the usual UNFOLD k-space sampling scheme. Additionally, the approach as described herein is not limited in its application to improving UNFOLD. It can also be used to improve other image processing techniques such as UNFOLD-SENSE, TSENSE, k-t BLAST and k-t SENSE.

An approach is presented that allows UNFOLD to handle disruptions in its temporal strategy. These disruptions are determined and accommodated in the image reconstruction process. In free-breathing applications, the respiratory motion causing disruptions is not readily known. A method has been developed, called here the operator R, to locate the thoracic cage and evaluate its anterior-posterior (A/P) respiration-related motion. The output of R is a plot of displacement as a function of time, used by UNFOLD as a temporal 'fingerprint', to characterize tissue movement due to respiration.

For simplicity, most of the theory is presented for cases where UNFOLD would be used by itself. A preferred implementation, where UNFOLD is merged with parallel imaging, is treated afterward. A major practical difference between UNFOLD and UNFOLD-SENSE in the current cardiac application comes from separating the FOV into dynamic and less-dynamic halves when UNFOLD is used alone [1], while the entire FOV is considered dynamic in UNFOLD-SENSE [2, 4].

The following description of theory is divided into four main parts. First, the effect of respiratory motion on the UNFOLD signal is described. Then, the extended version of UNFOLD is described, which can handle motion with known temporal characteristics. Next, the proposed R operator is described, which can be used to estimate these temporal characteristics from in vivo data. Finally, it is demonstrated that the proposed approach can be inserted into UNFOLD-SENSE, and can be made iterative for added precision.

Effect of Respiratory Motion on the UNFOLD Signal

In UNFOLD, in parallel imaging, and also in "reduced-FOV" methods [9, 10], the acquisition process is accelerated by acquiring an FOV smaller than the imaged object. An FOV n-times too small provides an acceleration factor of n, and n different spatial locations are overlapped into any given pixel. These various fast-imaging approaches differ in the way they separate the overlapped signals, to reconstruct a de-aliased result. UNFOLD operates by modulating the n overlapped signals with respect to each other, along the temporal dimension. This is achieved by shifting the k-space sampling function by a fixed increment from one time frame to the next [1], a sampling strategy sometimes referred to as a "sheared grid in k-t space" [5], referring to the k-t space formalism introduced by Xiang et. al. [11].

In an implementation of UNFOLD, with n=2, one alternates the k-space acquisition between even and odd lines (e.g., even lines for even frame, odd lines for odd frames). This sampling scheme imposes a Nyquist-frequency modulation onto the aliased signals. When observed in the time domain, aliased materials seem to 'flicker' as they reverse their phase from one time frame to the next. As depicted in FIG. 1a, non-aliased tissues are expected to appear near the DC temporal frequency, while aliased tissues are expected near the Nyquist frequency.

Suppose the imaged object contains features that are moving along a direction $\theta$, with displacement equal to d(t) ($\theta \equiv 0$ on the x-axis). As a result of this motion, phase shifts are applied to the k-space representation of the object [12]. From the shift theorem of the Fourier transform, a given k-space point $(k_x, k_y)$ receives a phase shift $\phi_d$ given by:

$$\phi_d(k_x, k_y, t) = -2\pi \cdot d(t) \cdot \left( \frac{\sin(\theta)}{FOV_y} \cdot k_y + \frac{\cos(\theta)}{FOV_x} \cdot k_x \right), \quad (1)$$

where $k_x$ and $k_y$ are integer numbers, i.e. coordinates in the k-space matrix. These phase shifts cause a modulation $M_d$ of the acquired data:

$$M_d(k_x, k_y, t) = \exp(i \cdot \phi_d). \quad (2)$$

Figure 1B:
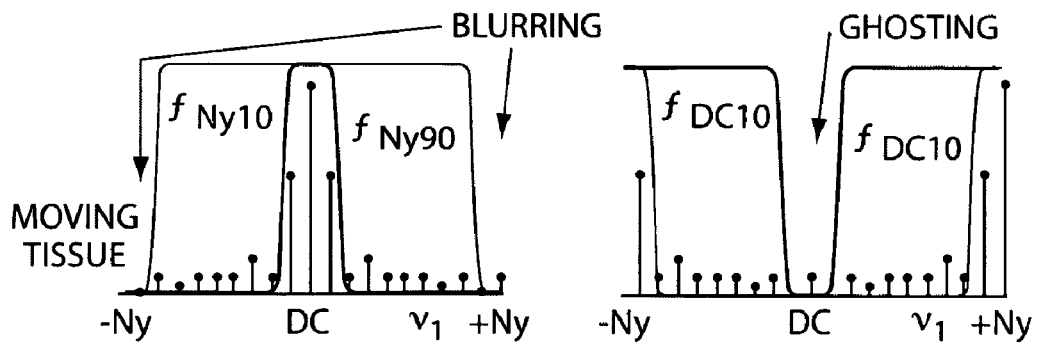
FIG. 1b illustrates that movement of object(s) within an image field causes the detected signal to spread over a wider range of frequencies, which decreases the likelihood that conventional UNFOLD can encode the aliased and non-aliased signals into distinct frequency regions.

Because $M_d$ multiplies the object's signal in the time domain, its temporal-frequency representation, $m_d(k_x, k_y, v)$, convolves the object's signal in the temporal-frequency domain. Consider any given k-space point $(k_x, k_y)$. As shown in FIG. 1a, when no motion is present, non-aliased and aliased signals for this k-space point are expected, respectively, at the DC and Nyquist temporal frequencies. As depicted in FIG. 1b, the effect of motion is to convolve these signals with $m_d(k_x, k_y, v)$. While UNFOLD attempts to store aliased and non-aliased signals in different parts of the temporal bandwidth, the motion effectively smears these signals over a range of frequencies, making their separation more difficult.

Different Fermi filters are displayed in FIG. 1b. For material in the dynamic half of the FOV, a filter $f_{Ny10}$ is used to filter out a Nyquist-centered region of width equal to 10% of the bandwidth, to separate aliased and non-aliased signals. In the less-dynamic half, a narrower filter $f_{Ny90}$ filters out 90% of the bandwidth. Filters to remove the DC region are defined as follows: $f_{DC10} = (1 - f_{Ny90})$, and $f_{DC90} = (1 - f_{Ny10})$.

Figure 1C:
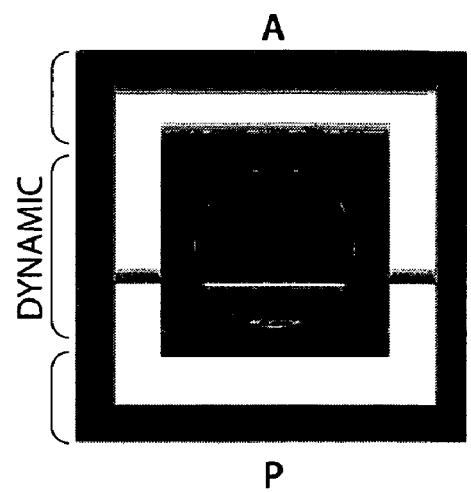
FIG. 1c illustrates that the motion illustrated in FIG. 1b causes blurring and ghosting artifacts in images produced through the use of conventional UNFOLD.

Signal that should have appeared near Nyquist may be displaced due to the convolution with $m_d(k_{x0}, k_{y0}, v)$, and may escape the filtering process. This corresponds to aliased signal not properly suppressed, leading to ghosting artifacts. This is shown on the right side of FIG. 1b, where signal from the Nyquist region leaked into the DC region. Similarly, signal near DC may be displaced to frequency locations that are being filtered out. This corresponds to desired information from non-aliased material being erroneously filtered out, leading to blurring artifacts (left side of FIG. 1b). FIG. 1c shows a simulation emulating an axial image, where the anterior part of the thorax moves in the anterior-posterior (A/P) direction, due to respiration. The motion of the anterior thoracic cage leads to ghosting and blurring artifacts. The remainder of FIG. 1 is explained in the next section.

An UNFOLD Extension to Accommodate Known Disruptions

The Fourier transform of a time series of images comprising $N_T$ frames requires a set of $N_T$ Fourier-basis functions, called here the set $\Omega_1$. Fourier basis functions are well known to form orthonormal sets. Orthonormality ensures that with $F_i(t)$ and $F_j(t)$ the $i^{th}$ and $j^{th}$ functions of the set:

$$\int F_i(t) \cdot F_j^*(t) dt = \delta_{ij}, \quad (3)$$

where '$\delta_{ij}$' and '*' represent, respectively, the Kronecker delta function and the complex-conjugate operator. Instead of using normal Fourier basis functions to time-transform the signal at a given k-space point $(k_x, k_y)$, one might use a different set of functions $\chi_2$, differing from Fourier functions through the modulation $M_d$ defined in Eq. 2:

$$G_i(k_x, k_y, t) = F_i(t) \cdot M_d(k_x, k_y, t) \quad (4)$$

Using Eqs 1 through 4, the set $\Omega_2$ is shown to be orthonormal:

$$\int G_i(t) \cdot G_j^*(t) dt = \int F_i(t) \cdot M_d M_d^* \cdot F_j^*(t) dt = \int F_i(t) \cdot F_j^*(t) dt = \delta_{ij}. \quad (5)$$

Figure 1D:
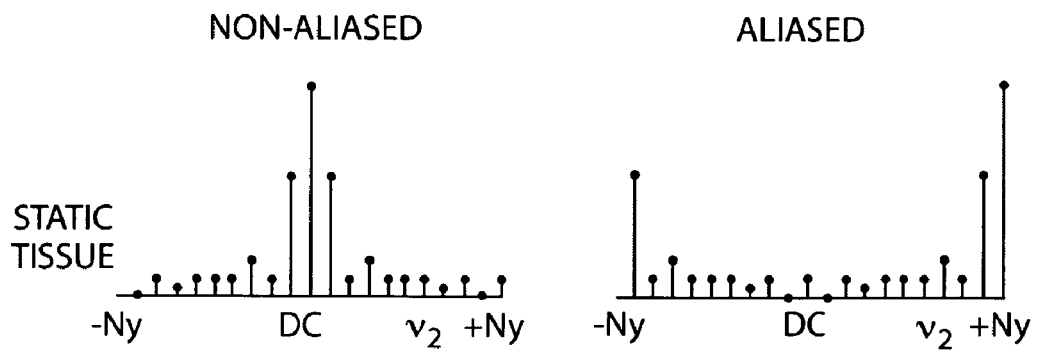
FIG. 1d illustrates that UNFOLD, when modified in accordance with some embodiments of the present invention to utilize a basis $\Omega_2$ different than the Fourier basis $\Omega_1$ ("non-Fourier basis"), has a reversed reference system relative to the conventional method in which signal from static object(s) is spread over a wider range of temporal frequencies.
Figure 1E:
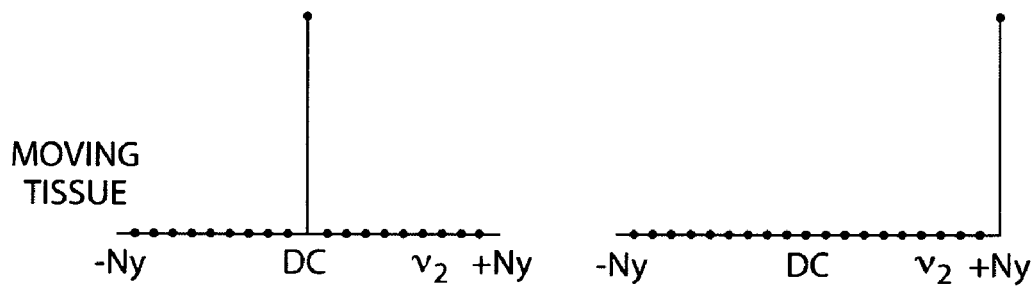
FIG. 1e illustrates that the modified UNFOLD method causes moving object(s) to be represented in the temporal frequency domain in a compact form, according to some embodiments of the present invention.
Figure 1F:
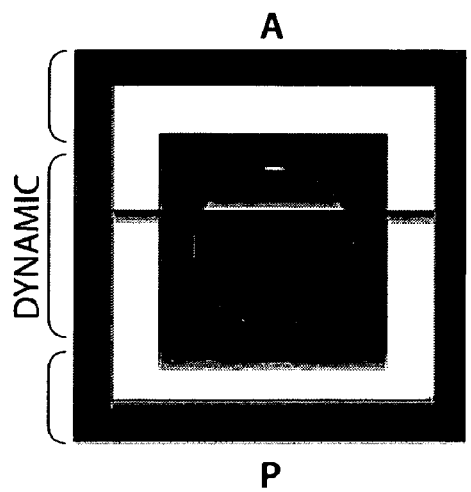
FIG. 1f illustrates that the modified UNFOLD method causes static object(s) to produce artifacts in reproduced images.

The effect of using $\Omega_2$ instead of normal Fourier functions is seen comparing FIGS. 1d-f to their counterparts in FIGS. 1a-c. Signal from moving tissues, which is smeared over many frequencies when using normal Fourier functions (FIG. 1b), appears at well-defined locations when using the set $\Omega_2$ (FIG. 1e). Conversely, signal from static tissues well localized over the Fourier basis (FIG. 1a) is now spread over many different locations using the set $\Omega_2$ (FIG. 1d). A transform using the set $\Omega_1$ leads to a frequency axis called $v_1$ in FIGS. 1a and 1b, while the set $\Omega_2$ leads to a pseudo-frequency axis called $v_2$ in FIGS. 1d and 1e. Assuming these frequency axes are discrete, the basis functions in $\Omega_1$ and $\Omega_2$ will be called, respectively, $F_{v1}$ and $G_{v2}$ from now on, using the frequency number as index. As seen comparing FIGS. 1c and 1f, the effect of using $\Omega_2$ is simply to change the reference system from one attached to the imager to one attached to the moving features: the material generating artifacts in FIG. 1c appears static in FIG. 1f, and vice-versa. The moving anterior part of the thoracic cage appears static in FIG. 1f, but the static posterior part now appears blurred and ghosted. The circle, which represents internal organs, is also blurred and ghosted in FIG. 1f. But because the circle is located within the dynamic half of the FOV, its artifacts are much fainter than for the posterior thoracic cage.

Identifying Signal from Moving Features

If it were possible to separate the signals from moving and non-moving features, it would be advantageous to transform the motion-corrupted signal using the $\Omega_2$ set, and the non-moving signal using the usual $\Omega_1$ Fourier set (FIG. 1). The UNFOLD filters would be applied independently in both the $\Omega_1$- and the $\Omega_2$-supported domains, the signals would then be transformed back to a common space such as the temporal domain, and recombined to yield the final, artifact-free result. Unfortunately, moving and non-moving signals cannot be easily separated. Each one of the $\Omega_1$ and $\Omega_2$ sets is sufficient to represent any time variation that might occur over $N_T$ time frames, and separating the available signal over the two sets is equivalent to solving a system of $N_T$ equations with $2N_T$ unknowns, a task impossible without introducing further information into the system.

Figure 2:
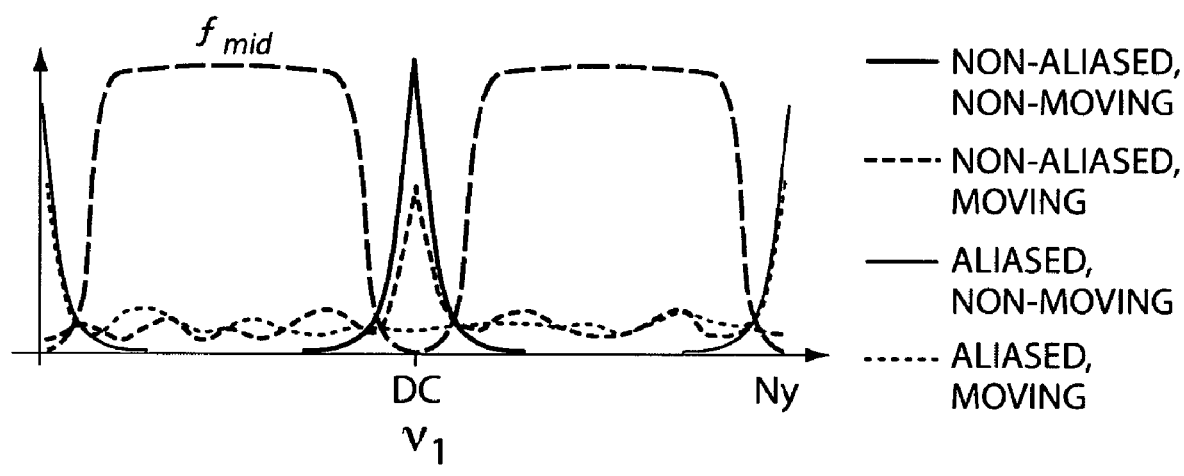
FIG. 2 illustrates that although four types of signal share the bandwidth in the temporal frequency domain, the intermediate frequencies selected by $f_{mid}$ tend to represent predominantly signal from moving objects.

In some embodiments, the method disclosed herein feeds on the prior knowledge/assumption that in the absence of motion, temporal-frequency spectra tend to be strongly peaked in their low-temporal frequencies. Motion has the effect of smearing these otherwise strongly peaked spectra, populating higher frequencies more heavily than they would normally be. FIG. 2 depicts a temporal-frequency spectrum $S(k_x,k_y,v_1)$ where four types of materials cohabit: 'non-aliased non-moving', 'non-aliased moving', 'aliased non-moving' and 'aliased moving' material. The method tries to interpret the signal with intermediate temporal frequencies in S as signal that should normally have belonged to the DC and Nyquist regions, if it were not for the effect of motion. To facilitate this classification, a third set of functions is described, $\Omega_3$, which is a filtered version of the set $\Omega_2$. A filter $f_{mid}=f_{Ny10}\cdot f_{DC10}$ is used to select mid-range frequencies (e.g., 80% of the bandwidth, see FIG. 2), and signal in these mid-frequencies is interpreted in part as originating from frequencies in the DC and Nyquist areas, given by the filter $f_{DC+Ny}=(1-f_{mid})$. With $g_{v2}(v_1)$ the temporal-frequency representation of $G_{v2}(t)$ in Eq. 4, the functions $h_{v2}(v_1)$ in the set $\Omega_3$ are given by:

$$h_{v2}(k_x, k_y, v_1) = \frac{g_{v2}(k_x, k_y, v_1) \cdot f_{mid}(v_1)}{l_{v2}(k_x, k_y)}, \quad (6)$$

where $l_{v2}$ is a scaling factor to normalize the functions, given by:

$$l_{v2}(k_x, k_y) = \sqrt{\sum_{v_1} (g_{v2}(k_x, k_y, v_1) \cdot f_{mid}(v_1))^2}. \quad (7)$$

To avoid dividing by zero, $l_{v2}$ is not allowed to go below an arbitrarily small threshold value $\epsilon$, for any combination of $k_x$, $k_y$ and $v_2$. As a result, $h_{v2}$ has a normalized 'length' of 1 when $l_{v2} \leq \epsilon$, and a length between 0 and 1 when $l_{v2} < \epsilon$. The set $\Omega_3$ describes a subspace included within the space spanned by the set $\Omega_2$, i.e., span$\{\Omega_3\} \leq$ span$\{\Omega_2\}$.

It is convenient to consider the problem in function-space, by interpreting different $v_1$ frequency locations as different coordinates in a space having $N_T$ dimensions. The frequency content of $S(k_x,k_y,v_1)$ at a given k-space point is represented by a vector $\vec{S}$, and the functions in Eq. 6 can be seen as unit-vectors $\vec{h_{v2}}$ and $\vec{g_{v2}}$. Each unit-vector $\vec{h_{v2}}$ represents how one unit of signal at a particular frequency $v_2$ would leak away to populate the mid-range frequencies on $v_1$, as a consequence of motion being present. The signal $\vec{S}$ is projected along the direction pointed by each unit-vector $\vec{h_{v2}}$:

$$D(k_x,k_y,v_2) = <\vec{S}, \vec{h_{v2}}^*>, \quad (8)$$

where the notation $<\vec{a}, \vec{b}>$ represents the inner product (i.e., dot product) of a vector $\vec{a}$ with a vector $\vec{b}$. Because the vectors $\vec{h_{v2}}$ are not expected to be orthogonal to each other, one must remove the projected signal before performing any new projection, and the order in which the projections are performed is important. With a total of $N_T$ frequency points, DC is found at $N_T/2$ and Nyquist at $N_T$, as shown in FIGS. 1 and 2. The projections in Eq. 8 are performed in the order $v_2=N_T$, $N_T/2$, 1, $N_T/2+1$, $N_T-1$, $N_T/2-1$, 2, $N_T/2+2$, etc. The value to be used for in Eq. 8 actually changes from one projection to the next, to remove any signal already projected. Using the index j to count the projections, p(j) gives the order along $v_2$ in which the projections are made, and the following recursive relationship gives the value for $\vec{S_j}$ to be used in Eq. 8, for the $j^{th}$ projection:

$$\vec{S_j} = \vec{S_{j-1}} - f_{DC+Ny}(p(j-1)) \cdot D(k_x, k_y, p(j-1)) \cdot \frac{\vec{g_{p(j-1)}}}{l_{p(j-1)}}. \quad (9)$$

Any signal left behind after all projections have been performed is interpreted as being associated with anatomical features that are not moving with respiration, appropriately represented by the basis-function set $\Omega_1$. Accordingly, with $j_{max}$ the total number of projections, $\vec{S_{j_{max}+1}}$ is equal to $P_{\Omega_1}(k_x, k_y, v_1)$, the signal to be treated in the $\Omega_1$-supported domain.

Correcting Blurring and Ghosting Artifacts

The matrix D in Eq. 8 contains information on how much signal the moving features would have contributed to the DC and Ny areas, if motion had not modified the temporal-frequency content. Referring to FIGS. 1a and 1b, one can identify four types of signals, on the basis of how it gets treated by the UNFOLD filter: (1) Correctly-preserved signal $C_P$, (2) correctly-removed signal $C_R$, (3) wrongly-preserved signal leading to ghosting-type artifacts $A_G$, and (4) wrongly-removed signal leading to blurring-type artifacts $A_B$. Each one of these signals is calculated both for features within the dynamic half of the FOV, and from the less-dynamic half. Since the processing is done in k-space, full-FOV images are actually reconstructed in both cases, but in the reconstruction, the dynamic and less-dynamic halves of the FOV are cropped from their respective full-FOV results. To keep the equations more compact, common terms are combined into a single variable Q:

$$Q(k_x, k_y, v_1, v_2) = \frac{f_{DC+Ny}(v_2) \cdot D(k_x, k_y, v_2) \cdot g_{v2}(k_x, k_y, v_1)}{l_{v2}(k_x, k_y)}, \quad (10)$$

leading to an estimate of the signal correctly preserved:

$$C_{Pdyn}(k_x, k_y, v_1) = \sum_{v_2} f_{Ny10}(v_2) \cdot f_{Ny10}(v_1) \cdot Q(k_x, k_y, v_1, v_2), \quad (11)$$

of the signal correctly removed:

$$C_{Pless}(k_x, k_y, v_1) = \qquad (12)$$
$$\sum_{v_2} f_{Ny90}(v_2) \cdot f_{Ny90}(v_1) \cdot Q(k_x, k_y, v_1, v_2),$$

$$C_{Rdyn}(k_x, k_y, v_1) = \sum_{v_2} f_{DC90}(v_2) \cdot f_{DC90}(v_1) \cdot Q(k_x, k_y, v_1, v_2),$$

$$C_{Rless}(k_x, k_y, v_1) = \sum_{v_2} f_{DC10}(v_2) \cdot f_{DC10}(v_1) \cdot Q(k_x, k_y, v_1, v_2),$$

of the signal causing ghosting artifacts:

$$A_{Gdyn}(k_x, k_y, v_1) = \qquad (13)$$
$$\sum_{v_2} f_{DC90}(v_2) \cdot f_{Ny10}(v_1) \cdot Q(k_x, k_y, v_1, v_2),$$

$$A_{Gless}(k_x, k_y, v_1) = \sum_{v_2} f_{DC10}(v_2) \cdot f_{Ny90}(v_1) \cdot Q(k_x, k_y, v_1, v_2),$$

and of the signal causing blurring artifacts:

$$A_{Bdyn}(k_x, k_y, v_1) = \qquad (14)$$
$$\sum_{v_2} f_{Ny10}(v_2) \cdot f_{DC90}(v_1) \cdot Q(k_x, k_y, v_1, v_2),$$

$$A_{Bless}(k_x, k_y, v_1) = \sum_{v_2} f_{Ny90}(v_2) \cdot f_{DC10}(v_1) \cdot Q(k_x, k_y, v_1, v_2).$$

Note that all values of $v_2$ such that $f_{DC+Ny}(v_2) \approx 0$ can be skipped in the calculations above, for faster processing. K-space matrices are calculated by recombining data associated with the set $\Omega_1$ along with data associated to $\Omega_2$. The gain provided by the proposed method lies in the inclusion of signal that would otherwise have been wrongly filtered out ($A_B$), and the exclusion of signal that would otherwise have been wrongly preserved ($A_G$):

$$K_{dyn}(k_x,k_y,v_1) = C_{Pdyn} + A_{Bdyn} + f_{Ny10} \cdot P_{\Omega 1},$$

$$K_{less}(k_x,k_y,v_1) = C_{Pless} + A_{Bless} + f_{Ny90} \cdot P_{\Omega 1}, \qquad (15)$$

where $P_{\Omega 1}$ is the signal left after all projections have been performed (equal to $S_{j_{max}+1}$, in Eq. 9). The final result, for a given imaging slice, is given by:

$$I(x, y_{dyn}, t) = (\mathcal{F}^{-1}\{K_{dyn}\})|_{y_{dyn}},$$

$$I(x, y_{less}, t) = (\mathcal{F}^{-1}\{K_{less}\})|_{y_{less}}, \qquad (16)$$

where $\mathcal{F}^{-1}$ represents a Fourier transform operator along all spatial-frequency and temporal-frequency directions, while $y_{dyn}$ and $y_{less}$ represent the set of y locations comprised in the dynamic and less-dynamic halves of the FOV, respectively. Although presented in the context of 2D imaging, it will be understood by a person of ordinary skill in the art that the method can be extended to 3D imaging.

Proposed Implementation of R, an Operator to Measure Respiratory Motion

Figure 3A:
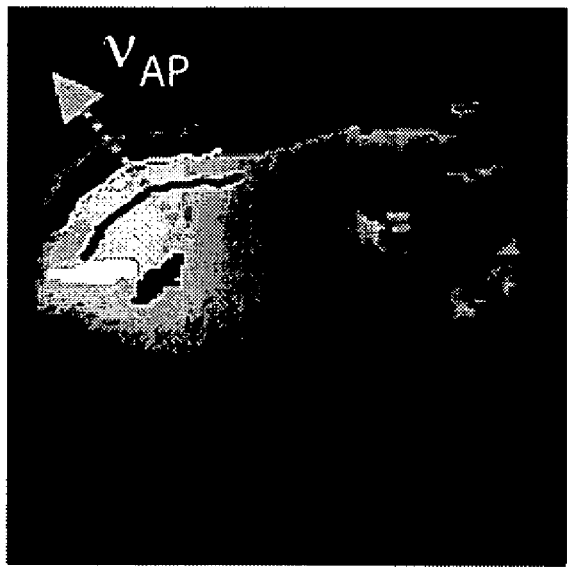
FIG. 3 illustrates a method for evaluating the anterior (A)/posterior (P) motion of the thoracic cage during an imaging scan, according to some embodiments of the present invention.

A method was developed to locate the thoracic cage in the FOV, and to get an estimate of its respiration-induced motion. In some embodiments, the method is completely automatic, with no user interaction. In a first step, the method locates the outline of the imaged object. Phased-array coil-elements gather very strong signals from tissues located near them, creating strong signal gradients near the edge of the body were signal goes abruptly from maximum (near the surface) to essentially zero (in the surrounding air). Such strong signal transitions, as seen in FIG. 3a for one of the eight coil-elements, make it fairly easy to locate the outline of the imaged anatomy.

More specifically, special sensitivity maps are generated using the SHRUG method described as part of UNFOLD-SENSE [4]. While the threshold value in the sensitivity maps is typically set at four times the noise's standard deviation, a much higher setting of 10 standard deviations is used for these special maps, to help ensure that essentially all pixels in the surrounding air are thresholded out (FIG. 3a). For a supine patient placement, it is the anterior part of the thorax that moves with respiration, and accordingly only data from the anterior section of the phased-array coil is used as input to the present method. Assuming the object is somewhat centered in the FOV, the method starts at the center of the FOV and traces rays in various directions, every 2 degrees. Transitions from high-intensity to low-intensity signal are detected using a cross-correlation with a 1D step function. After having removed negative correlations (corresponding to transitions from low-intensity to high-intensity), the correlations from the individual coils are combined with a root-sum-of-squares operator, and the spatial location associated with a preferred (e.g., maximum) correlation is identified. In case of ambiguity, when more than one correlation peak falls within 10%, the one located spatially the furthest along the ray is chosen (to help avoid transitions from inside the body, from edges in air-filled regions).

To help eliminate outliers, the periphery of the object is calculated by connecting the points, and the effect of removing one point on shortening the periphery is calculated. The point contributing the most to the periphery is removed. Out of the 180 original points, this process is repeated until 20% have been removed, leaving 144 points to trace the outline of the object. A unit-vector $\vec{v}_{AP}$ is found that gives the orientation of the projection of the A/P direction into the 2D imaging plane, and from the points along the body's periphery, the one located the furthest in the anterior direction is identified. This point is referred to as $P_A$, and it is considered part of the anterior segment of the thoracic cage. $P_A$ and its closest neighbors are preserved to form a curve $c_0$, one tenth of the whole periphery in length (middle curve in FIG. 3a). A curve $c_1$ is obtained by displacing $c_0$ by 2 cm in the anterior direction, and a curve $c_{-1}$ by displacing $c_0$ 2 cm in the posterior direction (outside and inside curves in FIG. 3a, respectively). A 2D step-function is created by giving a value of −1 to pixels between $c_1$ and $c_0$, and a value +1 to pixels between $c_0$ and $c_{-1}$ (upper and lower regions, respectively, in FIG. 3b).

Figure 3B:
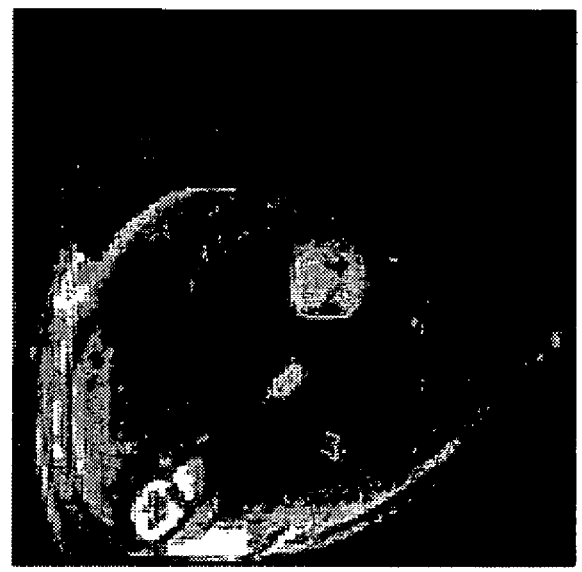

A standard version of UNFOLD or UNFOLD-SENSE is used to get a first estimate of the result. In the case where UNFOLD is used alone, the whole FOV is filtered with a narrow filter (HWHM=10% of bandwidth) to help ensure that the dynamic motion of the thoracic cage is not seriously affected by the filter. Assuming that the thoracic cage moves in the A/P direction, a 1D cross-correlation is performed by displacing the 2D step-function by increments of 0.2 mm along the $\vec{v}_{AP}$ direction. The location of maximum correlation is found, and this correlation process is repeated, e.g., for every time frame. The displacement function d(t) is obtained as a result, and is used as part of Eq. 1. The angle θ in Eq. 1 is given simply by the orientation of $\vec{v}_{AP}$. An example is given in FIG. 3b showing the 2D step function as an overlay at its location of maximum correlation, for this particular time frame (near full inspiration in this case).

Note that, in other embodiments, several other types of methods and/or other sources of information (e.g., respiration-monitoring belt, or navigator echoes) could be used as alternatives to the R method proposed here.

Inserting the Approach into UNFOLD-SENSE, and Adding an Iteration Loop

In the UNFOLD-SENSE method, UNFOLD is used to create two narrow frequency bands, one at DC and one at Nyquist, where only half of the spatially-aliased components are present. While the Nyquist region is simply filtered out, the DC region is treated with a parallel-imaging method having half the acceleration of that used for the rest of the bandwidth [2]. UNFOLD effectively removes artifacts by filtering out those that are modulated at the Nyquist frequency, and by allowing the DC region (where much of the bandwidth's energy is expected) to be treated with a more reliable parallel imaging method, having a smaller acceleration factor.

The fusion of the present modified version of UNFOLD with parallel imaging is completely analogous to that presented in UNFOLD-SENSE [2, 4]. Differences come from filtering out not only the signal found near Nyquist but also all signal originating from the Nyquist region, and from using a twice-lower acceleration factor to treat not only all signal found near DC but also all signal originating from the DC region. $K_{less}$ in Eq. 15 gives the signal originating from the DC region, while $K_{dyn}$ gives the signal originating from anywhere in the bandwidth except for the Nyquist region. With $O_n\{\ \}$ and $O_{n/2}\{\ \}$ representing parallel-imaging operators with, respectively, a full acceleration of n and a reduced acceleration of n/2 [2], the reconstructed result is given by:

$$I(x,y,t)=\mathcal{F}_t^{-1}\{O_{n/2}\{K_{less}\}+O_n\{K_{dyn}-K_{less}\}\}, \quad (17)$$

where $\mathfrak{I}_t^{-1}\{\ \}$ represents an inverse-Fourier transform along the temporal-frequency axis. The spatial inverse-Fourier transforms are assumed to be included into the parallel-imaging operator. Note that with UNFOLD-SENSE, the entire FOV is dynamic.

Figure 4:
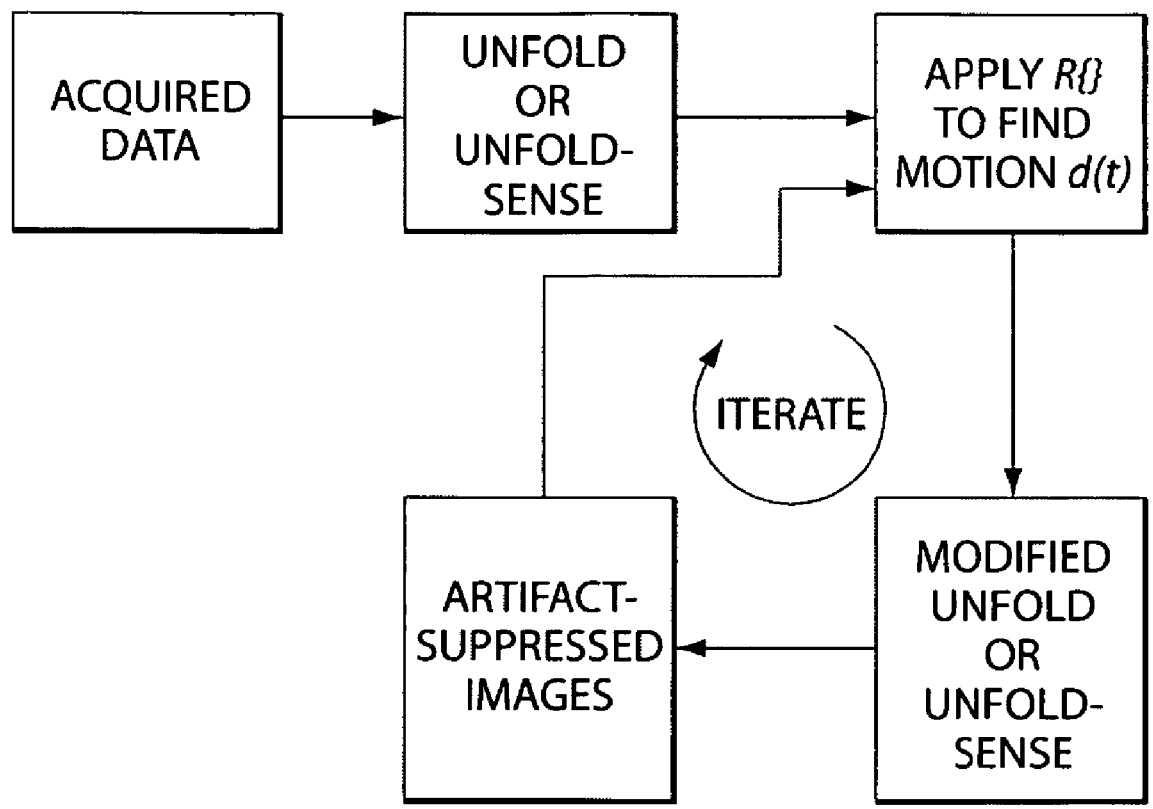
FIG. 4 is a block diagram of the method of FIG. 3 according to some embodiments of the present invention.

As depicted in FIG. 4, the present method can be made iterative. Iteration 0 involves applying a normal version of UNFOLD or UNFOLD-SENSE. The result of the $0^{th}$ iteration is used to identify the respiratory motion d(t) along a direction θ, through the use of the proposed operator R. The motion information is used to obtain an improved result, where artifacts have been suppressed. Presumably, a better motion estimate $d_1(t)$ might be obtained from these improved images, allowing a new pass through the processing (FIG. 4). The iterative loop can be repeated a number of times, potentially leading to improvements in motion estimation and compensation. Such iterations proved useful in simulations, and significant improvement was noticed in the in vivo data with one iteration. The $0^{th}$ iteration, i.e., normal UNFOLD or UNFOLD-SENSE, was apparently not very far from the desired solution to begin with.

EXAMPLES

The proposed approach was implemented on a 1.5 T imager (GE Medical Systems, Milwaukee, Wis., software release 11.0) equipped with eight receiver channels, using a product GE eight-element cardiac phased-array coil. Data was acquired using a modified version of an interleaved-EPI myocardial-perfusion sequence originally developed in the context of the UNFOLD-SENSE project [4]. The reconstruction was performed in part using programs written in the C language, and in part using programs written in the Matlab language (The MathWorks, Natick, Mass.).

Five patients were recruited, and results from all five are shown here. Three were imaged with an acceleration of 2.0, and two with an acceleration of 3.0. The acceleration of 2.0 was used to increase the number of slices acquired in one heartbeat, while the acceleration of 3.0 was used to reduce from 4 to 2 the number of echoes per TR-period, and to slightly increase the number of slices. The recruited patients were being scanned for suspected Arrythmogenic Right Ventricular Dysplasia (ARVD). While the clinical protocol includes an injection of Gd-DTPA as part of a myocardium viability test, the imaging of the first pass with a myocardial-perfusion sequence is not required for the ARVD diagnosis. The first pass could thus be imaged with our research sequence without compromising the validity of the clinical exam. The injection rate was 5 ml/s via an antecubital vein, at a weight-based contrast dose of 0.05 mmol/l. Informed consent was obtained from all patients.

Furthermore, simulations were performed of a circle (representing the heart), surrounded by a rectangle (representing the thoracic cage). The anterior part of the 'thoracic cage' moved from one simulated frame to the next, to mimic breathing motion. The simulation was written in the Matlab language.

Results

Five patients were imaged, with parameters shown in the following Table 1:

|  | Matrix size | Acceleration factor | # of time frames | # of slices | Echoes per train | FOV (cm) |
|---|---|---|---|---|---|---|
| Patient #1 | 96 × 128 | 2.0 | 60 | 5 | 4 | 34 |
| Patient #2 | 96 × 128 | 2.0 | 60 | 6 | 4 | 30 |
| Patient #3 | 128 × 128 | 2.0 | 50 | 6 | 4 | 27 |
| Patient #4 | 128 × 128 | 3.0 | 50 | 4 | 2 | 32 |
| Patient #5 | 128 × 128 | 3.0 | 50 | 4 | 2 | 30 |

Figure 5:
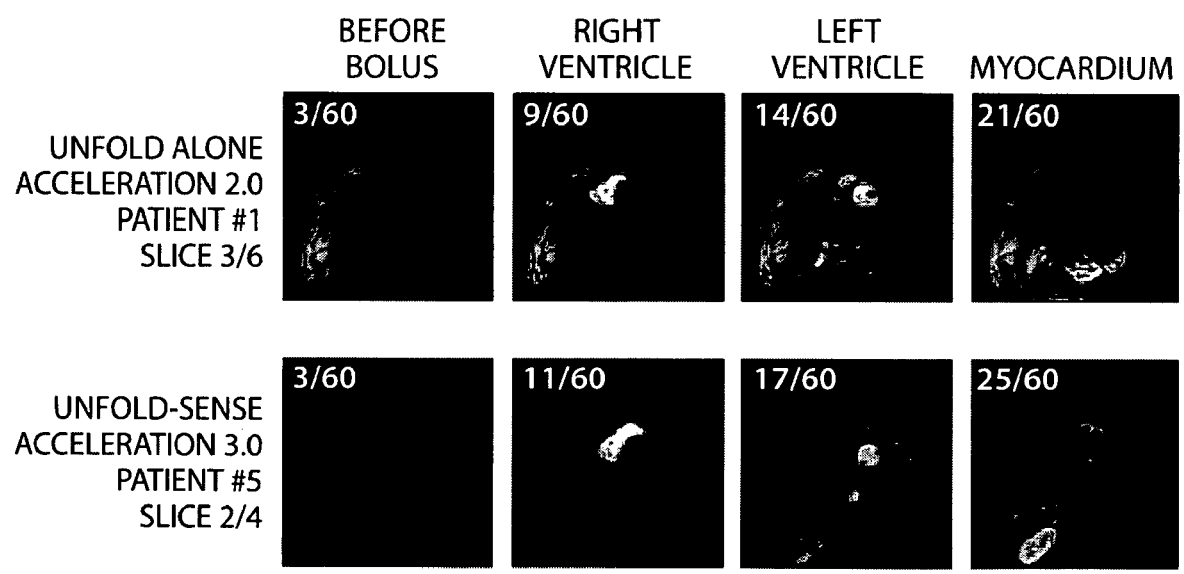
FIG. 5 shows results from first and last patients, using conventional versions of UNFOLD and UNFOLD-SENSE, respectively.

FIG. 5 shows results from Patients #1 and #5, reconstructed with the normal versions of UNFOLD and UNFOLD-SENSE. These results, obtained with the non-modified methods, featured reasonable image quality, and to a large extent looked very similar to those obtained with the addition of the inventive modification. But in some volunteers and some slices, in specific time frames when larger amounts of breathing motion occurs, artifacts could be found in the results from the non-modified methods that were significantly suppressed by the inventive approach.

UNFOLD by Itself

Figure 6:
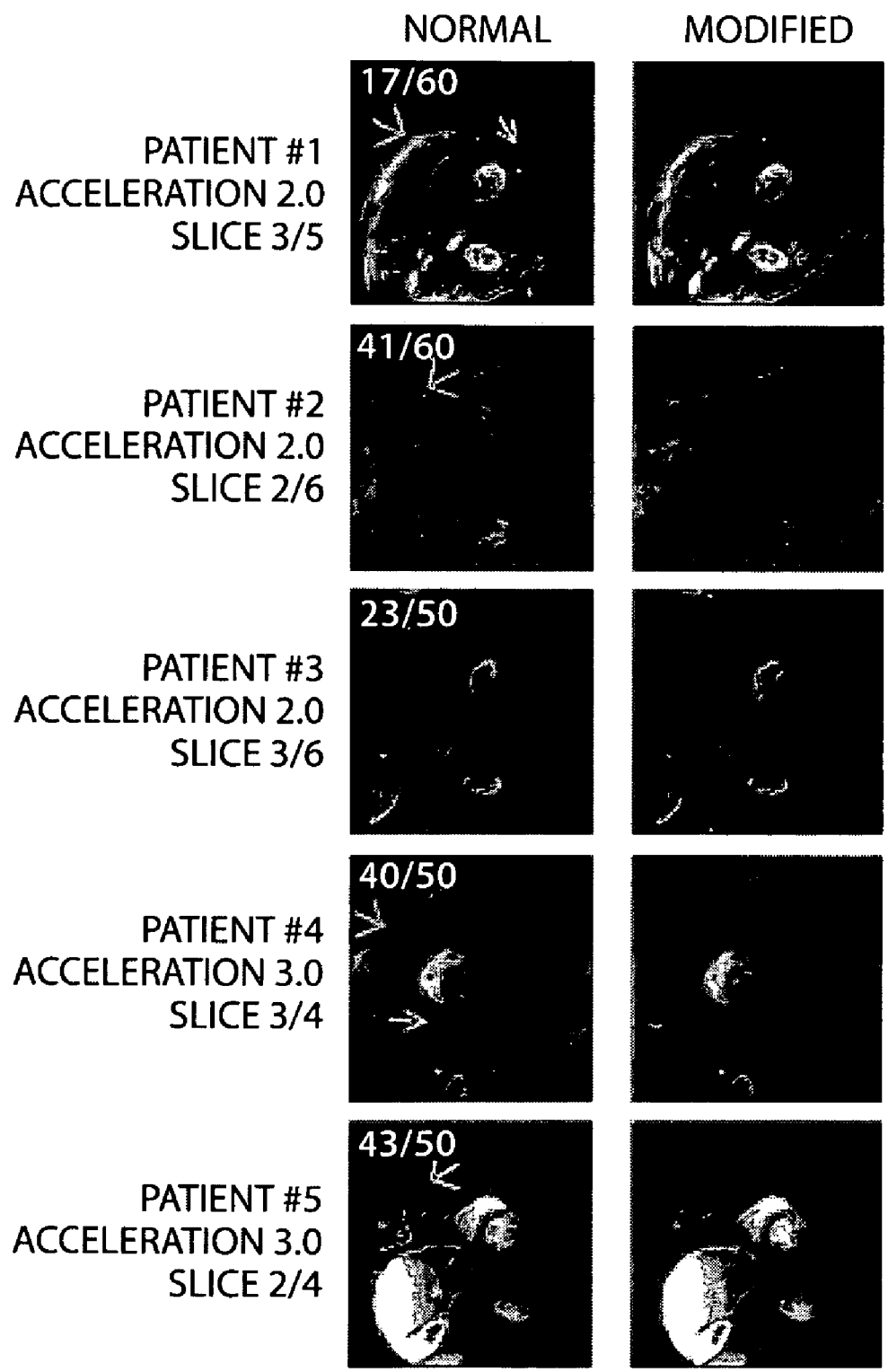
FIG. 6 is a comparison of the conventional and modified versions of UNFOLD, which shows that the modified UNFOLD method suppresses artifacts not suppressed by the conventional version, according to some embodiments of the present invention.

FIG. 6 shows results obtained with UNFOLD, with and without the proposed modification. Gray and white arrows point, respectively, to blurring artifacts and ghosting artifacts. Because parts of the FOV have lower temporal resolution, a quickly-moving anatomical feature lying over the divide between regions of different resolution would appear disjointed, as the part in the lower-temporal resolution region lags behind in its displacement. Note that this effect does not occur in UNFOLD-SENSE, where the whole FOV has the same temporal resolution. Examples of such disconnects are shown by gray arrows, on the left side of FIG. 6. These artifacts are very effectively corrected by the proposed approach, as can be seen on the right side of FIG. 6. Furthermore, when large amounts of breathing motion occurs, the ability of UNFOLD to remove aliasing artifacts may be reduced. White arrows (FIG. 6, left side) show residual aliasing artifacts, significantly suppressed by the proposed approach (FIG. 6, right side). No arrow is seen in the images from patient #3, as no significant difference could be found in the data sets reconstructed with and without the proposed approach.

Figure 7A:
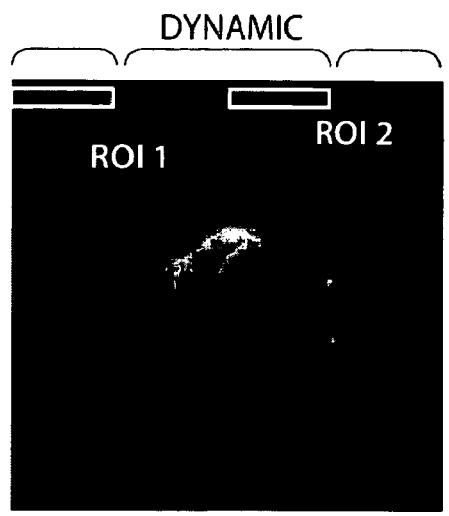
FIG. 7 shows the noise level in two different ROI's, one in the dynamic region and one in the less-dynamic region, for the normal and modified versions of UNFOLD, according to some embodiments of the present invention.
Figure 7B:
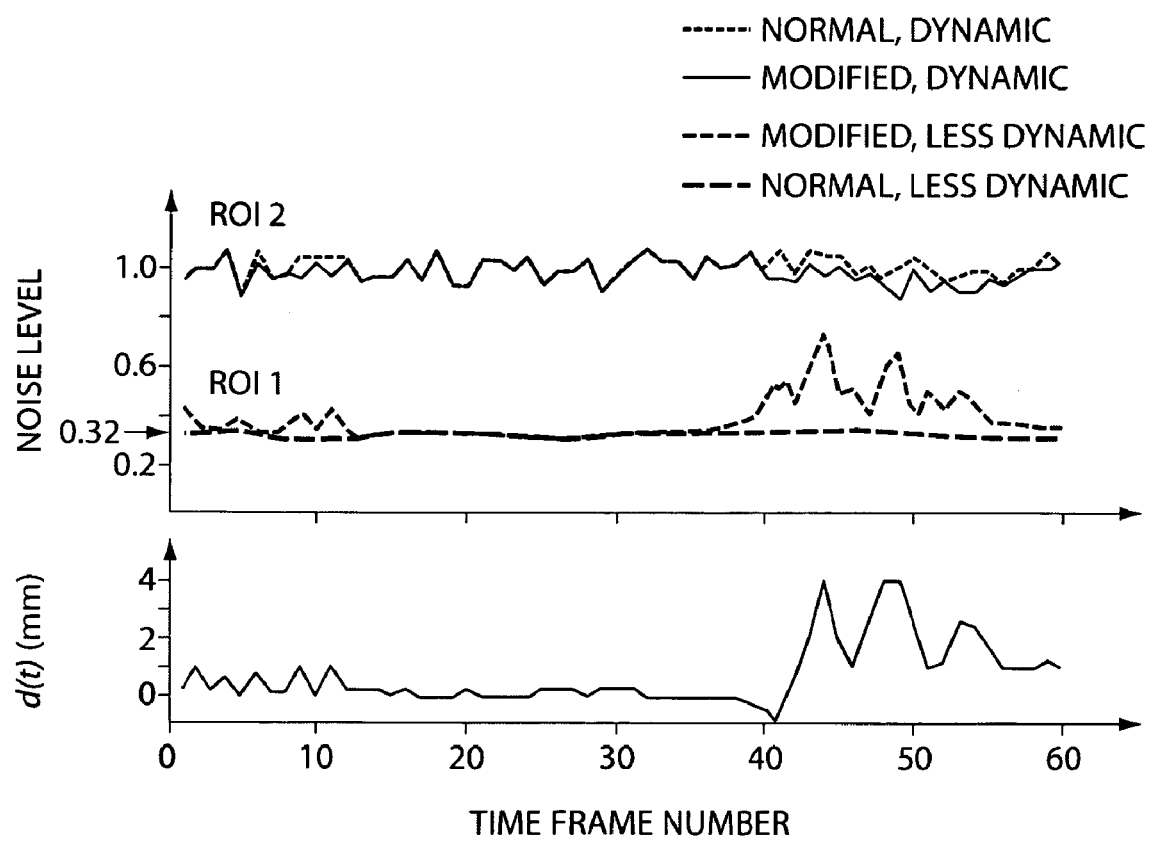

FIG. 7 shows how the noise level depends on the amount of motion present. ROI's were placed in regions where no signal is expected, in the images obtained with Patient #2. The mean noise level in the standard-UNFOLD results, in the dynamic region (ROI 2), was normalized to 1.0 (solid gray line). The noise level in the less-dynamic region is expected to be lower by a factor of:

$$\sqrt{\frac{\int f_{Ny90}^2}{\int f_{Ny10}^2}} = 0.32, \tag{18}$$

as indicated in FIG. 7. The noise level in the dynamic and less-dynamic regions for the modified version of UNFOLD are given, respectively, by the solid and dashed black lines in FIG. 7. The displacement d(t) is shown in the lower plot. Note that between the $10^{th}$ and the $40^{th}$ time frames, very little breathing motion occurred. As could be expected, in the absence of motion, the normal (gray lines) and modified (black lines) version of UNFOLD had equivalent noise properties. But as sudden displacements occurred, missing information had to be reintroduced to avoid blurring artifacts (FIG. 1). Noise was reintroduced along with this information, causing an increase in the noise level of the less-dynamic part of the modified-UNFOLD results whenever sudden motion occurred. While the proposed modification can correct motion-induced blurring artifacts (e.g., gray arrows in FIG. 6), the price to pay is, not surprisingly, an increase in the noise level in the less-dynamic region compared to the standard-UNFOLD results.

UNFOLD-SENSE

Figure 8:
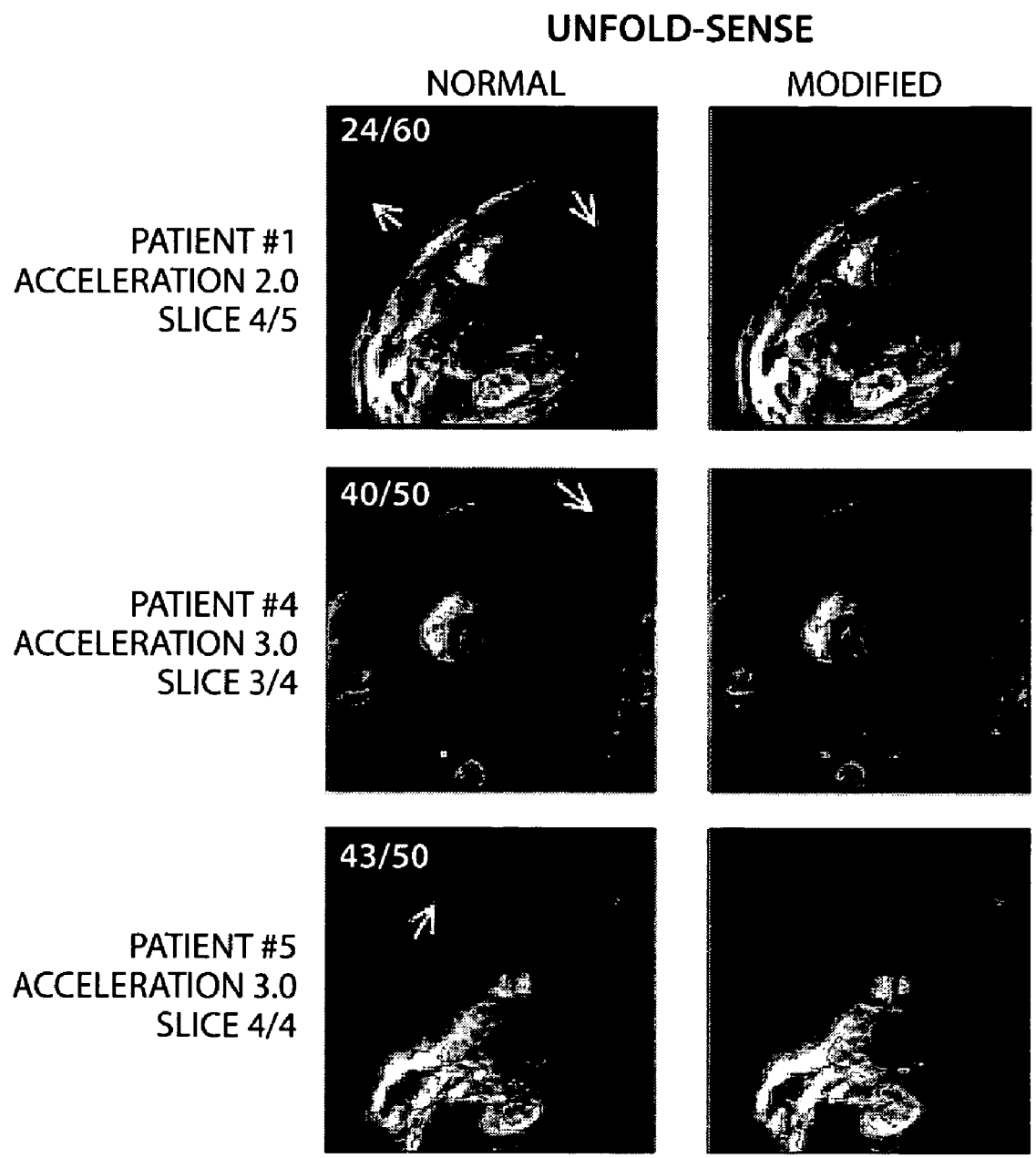
FIG. 8 is a comparison of the conventional and modified versions of UNFOLD-SENSE, showing that the modified version suppresses artifacts not suppressed by the conventional version, according to some embodiments of the present invention.

For the most part, there were very little artifacts in the images reconstructed with the normal version of UNFOLD-SENSE. The left side of FIG. 8 shows a few instances where residual ghosting artifacts were seen, and these artifacts were significantly suppressed, as seen on the right side of FIG. 8.

Discussion: A Different Application for this Approach

The present work incorporates into UNFOLD the knowledge that time-related events might be perturbing its temporal encoding-strategy. The perturbation is expressed here as a displacement d(t), occurring at an angle θ in the imaging plane. An operator R was proposed to evaluate d(t) and θ from in vivo data, in cases where the motion is respiration-induced. Another possible application would involve perturbations caused by changes in the usual UNFOLD sampling scheme. The UNFOLD applications presented up to now use a sampling strategy whereby the sampling function is shifted by a fixed increment from time frame to time frame, a scheme sometimes referred to as a 'sheared grid in k-t space' [5, 11]. To diversify the locations visited during a scan, there might be advantages in departing from this rigid sampling strategy. The approach presented here could be used to reconstruct the corresponding acquired data. In many ways, such application is simpler than the one pursued here, as the sampling strategy is known a priori, unlike respiratory motion.

Figure 9:
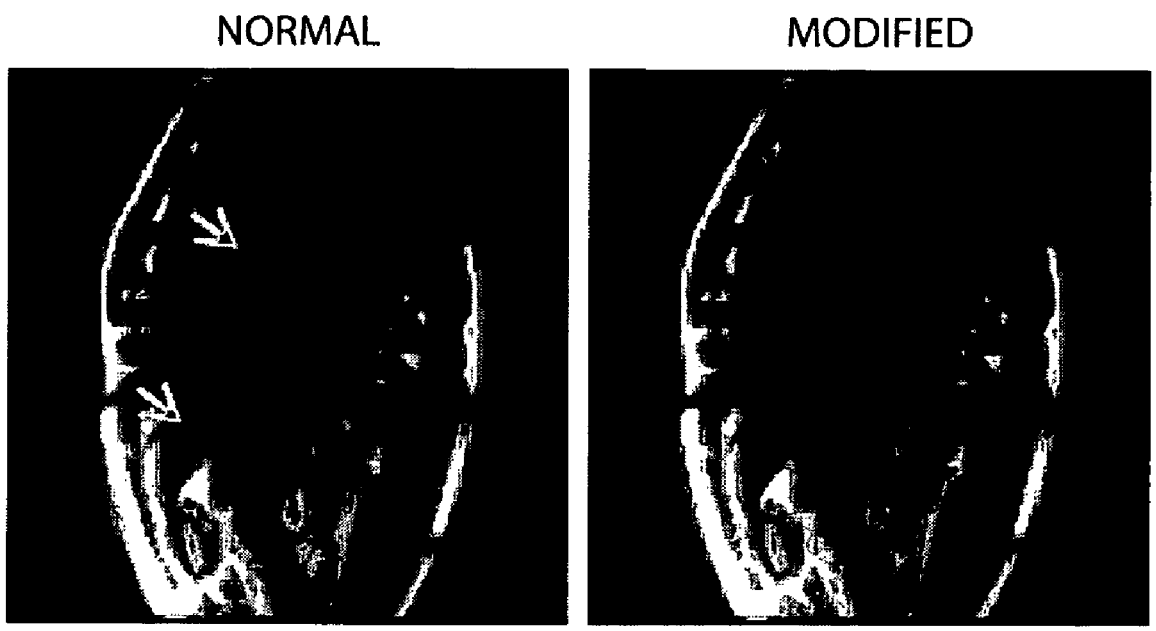
FIG. 9 is another comparison of the conventional and modified versions of UNFOLD, showing that the modified version provides the flexibility to handle an irregular sampling scheme in the sampling function, according to some embodiments of the present invention.

For example, suppose one line out of every four is sampled in k-space. Four regular, interleaved sampling functions, referred to as A, B, C and D, could be used equally well (A+B+C+D represents a full sampling). To push aliasing artifacts to the Nyquist frequency, one could alternate in time between A and C, a sampling strategy referred to here as (A,C,A,C,A,C, ... ) [4], but locations in B and D would never get sampled. Alternately, one could use a strategy (A,B,C,D, A,B,C,D, ... ) [3, 5], but then artifacts are not displaced all the way to Nyquist, and remain overlapped with desired signals. Instead, a non-regular scheme (A,C,A,C, ... A,C,B,D,B, D, ... B,D,A,C ... ) can be used, so that all locations get sampled (e.g., for self-calibration), but most of the artifact energy is displaced to Nyquist. While normal filtering would lead to artifacts, our approach can better handle variations caused by this discontinuous sampling scheme (FIG. 9).

Material Moving Differently than the Thorax

In the present implementation, the reconstruction process is 'informed' of only one type of motion: the one detected by the operator R. In our experience, from simulations, only artifacts from motions closely related to this target-motion are significantly suppressed. Artifacts caused by motion in other directions and/or with different temporal characteristics are left mostly unaffected, neither improved nor worsened.

Of course, not all anatomical features move the same way when one breathes. Different features may move with different amplitudes, or in different directions. For example, while the thoracic cage moves mostly along the A/P direction, the heart moves mostly along the superior/inferior (S/I) direction [13] during breathing. Since motion is detected on the anterior part of the thoracic cage, it is possible that only features with similar motion will benefit from the proposed approach. But because the thoracic cage is located close to the receiver coils and is typically very bright, and that it tends to be located about half an FOV away from the heart, artifacts from the thoracic cage appear to have been the main difficulty related to using UNFOLD in free-breathing situations. Although the proposed approach may not necessarily help for all respiration-induced types of motion, it is expected to handle the one type that typically causes most difficulties.

Handling More General Types of Motion

By using more general motion models than the one in Eq. 1, the proposed approach can be readily applied to any motion in a 2D imaged-plane, or in a 3D imaged-volume. The R method described herein may be suitable for modeling displacements along a line, however, more elaborate detection schemes could be used instead to detect motion in 2D or 3D. Furthermore, the proposed approach could be generalized to handle several different types of motion at once. Challenges would include getting reliable measurements of these various motions, and avoiding the accidental removal of non-aliased signal. This latter point is explained in more detail in the following. In general, UNFOLD functions by forcing aliasing artifacts to behave in peculiar ways through time, so they can be identified and removed. More specifically, in the present results, aliasing artifacts were expected to flicker in time, while possibly also moving in synchrony with the anterior thoracic cage. The presented method is based on the assumption that legitimate anatomical signals are unlikely to behave in such a way. But if several different types of motion were treated at once, the odds that legitimate signal might share temporal characteristics with one or more of these motions would increase with the number of motion types considered, introducing a risk that a significant amount of non-aliased signal might be erroneously filtered away.

Acceleration Factors

Acceleration factors of 2 and 3 were obtained, both for UNFOLD used by itself, and for UNFOLD-SENSE. While UNFOLD can provide higher acceleration factors when signals are periodic, such as in functional MRI [1], in the present myocardial perfusion application one would not expect UNFOLD's acceleration to exceed 2.0. The 3.0 results obtained with UNFOLD by itself (FIG. 6, patients 4 and 5) can be explained by the variable-density sampling scheme used here, to accommodate the SHRUG self-calibration scheme [4]. The 3.0 acceleration consists of a factor of 2.0 from UNFOLD, combined with a factor of 1.5 from the reduction in sampling density in outer k-space regions [14, 15]. Taking the effect of the UNFOLD filter into account, the UNFOLD acceleration is in fact 1.8, for a total acceleration of 2.7 when combined with variable-density imaging.

Although the acceleration factors obtained here (may seem modest for parallel imaging, the proposed UNFOLD-SENSE approach is readily applicable to situations with higher acceleration factors. Acceleration in the implementation used during testing is mostly limited by the number of independent channels on the system (8 channels), and the currently cardiac phased-array coil which is not optimized for parallel imaging of the heart, in that only four of the eight coil elements effectively cover the upper thorax.

Recombining the Separated Signals

A portion of the method proposed here involves separating features that are moving with respiration from features that are not, through the projections in Eq. 8. This separation is not expected to be precise or complete. Fortunately, the proposed method is rather forgiving of errors committed in the separation, mostly because the separated signals are recombined shortly thereafter, in Eq. 15. In standard UNFOLD, the entirety of the signal would be treated with filters that are in fact appropriate only for features that are not displaced with respiration. Even an imperfect separation of moving and non-moving features, allowing the main bulk of the signal from moving features to be treated in a more appropriate $\Omega_2$ space, can lead to significant improvements in artifact suppression. Unlike methods relying on matrix inversions, such as parallel imaging or the training-scan strategy in k-t BLAST, UNFOLD (both normal and modified versions) does not amplify noise. As could be expected, the modified and non-modified versions of UNFOLD become equivalent in the limit where the amplitude of the treated motion approaches zero.

Embodiments using the techniques discussed provide numerous capabilities. For example, the UNFOLD-SENSE technique can be improved. Fold-in artifacts especially from fat of the thoracic cavity can be removed reliably. Interpretation of a perfusion defect in the presence of a fold-in overlapping the myocardium in a cardiac short-axis view can be improved. Artifacts in the presence of motion can be reduced. Better calibration for parallel imaging can be provided.

Thus, the UNFOLD approach was extended to accommodate situations where its temporal strategy is disturbed by time-related events, such as respiratory motion. This is achieved by constructing an alternate basis set for filtering, tailored to the estimated disruptions. The approach was shown to be useful in myocardial perfusion studies that employed UNFOLD, both with and without parallel imaging, although the present work could be applied to, for example, any hybrid method based in part on UNFOLD, such as TSENSE, UNFOLD-SENSE, k-t BLAST and k-t SENSE.

Insofar as embodiments of the present invention described above are implementable, at least in part, using a computer system, it will be appreciated that a computer program for implementing at least part of the described methods and/or the described systems is envisaged as an aspect of the present invention. The computer system may be any suitable apparatus, system, or device. For example, the computer system may be a programmable data processing apparatus, a general purpose computer, a Digital Signal Processor, or a microprocessor. The computer program may be embodied as source code and undergo compilation for implementation on a computer, or may be embodied as object code, for example.

It is also conceivable that some or all of the functionality ascribed to the computer program or computer system aforementioned may be implemented in hardware, for example by means of one or more application specific integrated circuits.

Suitably, the computer program can be stored on a carrier medium in computer usable form, which is also envisaged as an aspect of the present invention. For example, the carrier medium may be solid-state memory, optical or magneto-optical memory such as a readable and/or writable disk for example a compact disk (CD) or a digital versatile disk (DVD), or magnetic memory such as disc or tape, and the computer system can utilize the program to configure it for operation. The computer program may also be supplied from a remote source embodied in a carrier medium such as an electronic signal, including a radio frequency carrier wave or an optical carrier wave.

Thus it is seen that dynamic magnetic resonance imaging with enhanced artifact suppression is provided. Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the inventions disclosed herein. Other, unclaimed inventions are also contemplated. The applicant reserves the right to pursue such inventions in later claims.

The following references are all hereby incorporated by reference herein in their entireties.

1. Madore B, Glover G H, Pelc N J. Unaliasing by Fourier-encoding the overlaps using the temporal dimension (UNFOLD), applied to cardiac imaging and fMRI. Magn Reson Med 1999; 42:813-828.
2. Madore B. Using UNFOLD to remove artifacts in parallel imaging and in partial-Fourier imaging. Magn Reson Med 2002; 48:493-501.
3. Kellman P, Epstein F H, McVeigh E R. Adaptive sensitivity encoding incorporating temporal filtering (TSENSE). Magn Reson Med 2001; 45:846-852.
4. Madore B. UNFOLD-SENSE: a parallel MRI method with self-calibration and artifact suppression. Magn Reson Med 2004; 52:310-20.
5. Tsao J, Boesiger P, Pruessmann KR k-t BLAST and k-t SENSE: dynamic MRI with high frame rate exploiting spatiotemporal correlations. Magn Reson Med 2003; 50:1031-42.
6. Di Bella E V, Wu Y J, Alexander A L, Parker D L, Green D, McGann C J. Comparison of temporal filtering methods for dynamic contrast MRI myocardial perfusion studies. Magn Reson Med 2003; 49:895-902.
7. Ablitt N A, Gatehouse P D, Firmin D N, Yang G Z. Respiratory reordered UNFOLD perfusion imaging. J Magn Reson Imaging 2004; 20:817-25.
8. Madore B. A new approach toward free-breathing 3D cardiac imaging: ISMRM. Miami, USA, 2005, pp 2233.
9. Hu X, Parrish T. Reduction of field of view for dynamic imaging. Magn Reson Med 1994; 31:691-4.

10. Fredrickson J O, Pelc N J. Temporal resolution improvement in dynamic imaging. Magn Reson Med 1996; 35:621-5.
11. Xiang Q-S, Henkelman R M. K-space description for MR imaging of dynamic objects. Magn Reson Med 1993; 29:422-428.
12. Korin H W, Farzaneh F, Wright R C, Riederer S J. Compensation for effects of linear motion in MR imaging. Magn Reson Med 1989; 12:99-113.
13. Wang Y, Riederer S J, Ehman R L. Respiratory motion of the heart: kinematics and the implications for the spatial resolution in coronary imaging. Magn Reson Med 1995; 33:713-9.
14. Pipe J G. Reconstructing MR images from undersampled data: data-weighting considerations. Magn Reson Med 2000; 43:867-75.
15. Peters D C, Korosec F R, Grist T M, Block W F, Holden J E, Vigen K K, Mistretta C A. Undersampled projection reconstruction applied to MR angiography. Magn Reson Med 2000; 43:91-101

The invention claimed is:

1. A method for accelerated dynamic MR imaging able to handle time-related disturbances, comprising:
   acquiring k-space data from an object at a first time point and a first k-space location;
   acquiring k-space data from the object at a second time point and a second k-space location;
   identifying potential movement of the object using the k-space data;
   separating temporal variations associated with time related disturbances from temporal variations not associated with time related disturbances;
   applying a first filter, in a first function space, to the k-space data not associated with the time related disturbances to obtain a first temporary dataset;
   applying a second filter, in a second function space, to the k-space data associated with the disturbances to obtain a second temporary dataset; and
   reconstructing an image of the object having reduced artifacts using the first and second temporary datasets.

2. The method of claim 1, wherein the disturbances are caused by motion.

3. The method of claim 2, further comprising evaluating the motion of the imaged object.

4. The method of claim 1, wherein the disturbances are caused by departures, in the temporal data sampling scheme, from the regular sampling scheme normally expected in the UNFOLD method.

5. The method of claim 1, further comprising using parallel imaging.

6. A method of imaging an object, comprising:
   acquiring k-space data about the object, wherein in the temporal frequency domain corresponding to the Fourier basis $\Omega_1$ the frequency content of a given k-space data point is represented by a vector $\vec{S}$;
   projecting the vector $\vec{S}$ along a vector $\vec{h}_{v2}$ to obtain projected k-space data, wherein the vector $\vec{h}_{v2}$ corresponds to a non-Fourier basis $\Omega_2$;
   producing an image of the object based at least in part on the projected k-space data;
   estimating movement of the object; and
   defining the vector $\vec{h}_{v2}$ based at least in part on the estimate.

7. The method of claim 6, wherein estimating movement of the object comprises estimating movement of the object based at least in part on the k-space data.

8. The method of claim 6, wherein estimating movement of the object comprises:
   generating a sensitivity map based at least in part on the k-space data;
   generating a correlation function based at least in part on the sensitivity map; and
   correlating an image of the object with the correlation function in order to estimate the movement, wherein the movement comprises a displacement and a direction of orientation.

9. The method of claim 6, wherein estimating movement of the object comprises estimating movement of the object based at least in part on data generated by a respiration-monitoring belt.

10. The method of claim 6, wherein estimating movement of the object comprises estimating movement of the object based at least in part on navigator echoes.

11. The method of claim 6, wherein:
   the object comprises the heart; and
   estimating movement comprises estimating movement of the heart due to respiration.

12. The method of claim 6, wherein producing an image of the object comprises producing an image of the object in which at least one artifact caused by blurring is suppressed, which artifact would be visible in the image due to blurring if the image had been generated using the Fourier basis $\Omega_1$ on the k-space data.

13. A method of imaging an object, comprising:
   acquiring k-space data about the object, wherein in the temporal frequency domain corresponding to the Fourier basis $\Omega_1$ the frequency content of a given k-space data point is represented by a vector $\vec{S}$;
   projecting the vector $\vec{S}$ along a vector $\vec{h}_{v2}$ to obtain projected k-space data, wherein the vector $\vec{h}_{v2}$ corresponds to a non-Fourier basis $\Omega_2$;
   producing an image of the object based at least in part on the projected k-space data; and
   wherein projecting the vector $\vec{S}$ along a vector $\vec{h}_{v2}$ comprises projecting $\vec{S}$ along multiple vectors $\vec{h}_{v2}$, wherein the multiple vectors $\vec{h}_{v2}$ are a subset of the basis functions included in the non-Fourier basis $\Omega_2$ defined as:

$$G_i(k_x, k_y, t) = F_i(t) \cdot M_d(k_x, k_y, t).$$

where $M_d$ is a modulation of the k-space data caused by motion of the object.

14. The method of claim 13, wherein projecting $\vec{S}$ along multiple vectors $\vec{h}_{v2}$ comprises iteratively projecting $\vec{S}$ along multiple vectors $\vec{h}_{v2}$ as follows:

$$\vec{S}_j = \vec{S}_{j-1} - f_{DC+Ny}(p(j-1)) \cdot D(k_x, k_y, p(j-1)) \cdot \frac{\overrightarrow{g_{p(j-1)}}}{\overline{l_{p(j-1)}}}.$$

wherein j is an index, p(j) defines the order in which the projections are made, $D(k_x, k_y, p(j-1))$ is a matrix representing the dot product between $\vec{S}$ and each vector $\vec{h}_{v2}$, $G_{p(j-1)}$ is a temporal frequency representation of $G_{p(j-1)}(k_x,k_y,t)$, and $l_{p(j-1)}$ is scaling factor, and wherein the value of $\vec{S}$ after all of the projections have been performed is the signal to be treated in the domain defined by the Fourier basis $\Omega_1$.

15. The method of claim 6, A method of imaging an object, comprising:
acquiring k-space data about the object, wherein in the temporal frequency domain corresponding to the Fourier basis $\Omega_1$ the frequency content of a given k-space data point is represented by a vector $\vec{S}$;
projecting the vector $\vec{S}$ along a vector $\vec{h}_{v2}$ to obtain projected k-space data, wherein the vector $\vec{h}_{v2}$ corresponds to a non-Fourier basis $\Omega_2$;
producing an image of the object based at least in part on the projected k-space data; and
wherein producing an image comprises of the object comprises producing an image of the object in which at least one artifact caused by ghosting is suppressed, which artifact would be visible in the image due to ghosting if the image had been generated using the Fourier basis $\Omega_1$ on the k-space data.

16. Apparatus for imaging a moving object, the apparatus configured to:
receive k-space data about the object, wherein in the temporal frequency domain corresponding to the Fourier basis $\Omega_1$ the frequency content of a given k-space data point is represented by a vector $\vec{S}$;
project the vector $\vec{S}$ along a vector $\vec{h}_{v2}$ to obtain projected k-space data, wherein the vector $\vec{h}_{v2}$ corresponds to a non-Fourier basis $\Omega_2$;
produce an image of the object based at least in part on the projected k-space data; and
estimate movement of the object; and
define the vector $\vec{h}_{v2}$ based at least in part on the estimate.

17. The apparatus of claim 16, wherein the apparatus is configured to estimate movement of the object based at least in part on the k-space data.

18. The apparatus of claim 16, wherein the apparatus is configured to estimate movement of the object by:
generating a sensitivity map based at least in part on the k-space data;
generating a correlation function based at least in part on the sensitivity map; and
correlating an image of the object with the correlation function in order to estimate the movement, wherein the movement comprises a displacement and a direction of orientation.

* * * * *

UNITED STATES PATENT AND TRADEMARK OFFICE
CERTIFICATE OF CORRECTION

PATENT NO. : 8,330,461 B2  
APPLICATION NO. : 12/518266  
DATED : December 11, 2012  
INVENTOR(S) : Bruno Madore Page 1 of 1

It is certified that error appears in the above-identified patent and that said Letters Patent is hereby corrected as shown below:

Column 1, line 15, "STATEMWNT" should be --STATEMENT--.

Column 17, Claim 6, line 64, "obiect" should be --object--.

Signed and Sealed this
Twelfth Day of February, 2013

Teresa Stanek Rea
*Acting Director of the United States Patent and Trademark Office*